Figure 1:
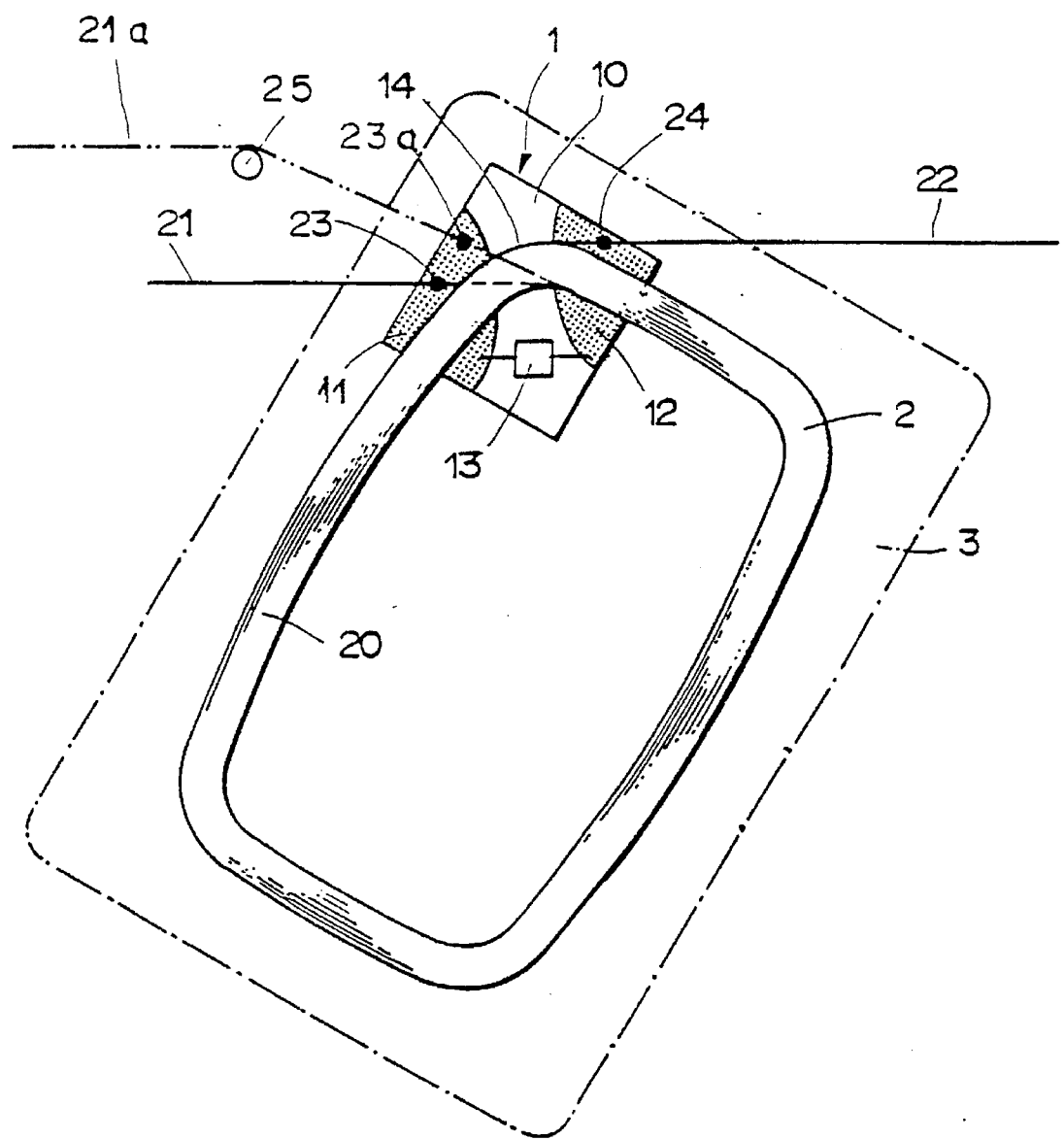

United States Patent [19]

Gustafson

[11] Patent Number: 5,649,352

[45] Date of Patent: Jul. 22, 1997

[54] PROCESS FOR ASSEMBLING A COIL ON A PRINTED CIRCUIT

[75] Inventor: Ake Gustafson, Chatel St-Denis, Switzerland

[73] Assignee: Sokymat S.A., Granges, Switzerland

[21] Appl. No.: 414,314

[22] Filed: Mar. 31, 1995

Related U.S. Application Data

[60] Division of Ser. No. 948,587, Sep. 23, 1992, which is a continuation-in-part of PCT/EP91/00672, Apr. 1, 1991 and PCT/EP92/00363, Feb. 20, 1992, and a continuation-in-part of Ser. No. 833,370, Feb. 10, 1992, Pat. No. 5,393,001.

[30] Foreign Application Priority Data

Apr. 19, 1990 [CH] Switzerland ............... 1329/90

[51] Int. Cl.⁶ ............................................. H01F 41/06
[52] U.S. Cl. ............... 29/605; 29/850; 140/92.1; 242/439; 242/439.4; 336/192
[58] Field of Search ............... 29/605, 805; 140/92.1, 140/93; 242/439, 439.2, 439.4, 440.1; 336/192

[56] References Cited

U.S. PATENT DOCUMENTS

| | | | |
|---|---|---|---|
| 3,445,797 | 5/1969 | Otto | ............... 336/192 |
| 3,670,277 | 6/1972 | Decker et al. . | |
| 3,956,751 | 5/1976 | Herman . | |
| 4,035,695 | 7/1977 | Knutson et al. . | |
| 4,074,227 | 2/1978 | Kalmus . | |
| 4,149,135 | 4/1979 | Roespel et al. | ............... 29/605 X |
| 4,506,238 | 3/1985 | Endoh et al. . | |
| 4,822,990 | 4/1989 | Tamada et al. . | |
| 4,860,433 | 8/1989 | Miura | ............... 29/605 |
| 4,947,180 | 8/1990 | Schotz . | |
| 4,992,794 | 2/1991 | Brouwers . | |
| 4,999,742 | 3/1991 | Stampfli . | |
| 5,025,550 | 6/1991 | Zirbes et al. . | |
| 5,050,292 | 9/1991 | Zirbes et al. . | |
| 5,072,508 | 12/1991 | Kaneko et al. | ............... 29/605 |
| 5,261,615 | 11/1993 | Cuttelod . | |
| 5,281,855 | 1/1994 | Hadden et al. . | |
| 5,321,240 | 6/1994 | Takahira . | |
| 5,337,063 | 8/1994 | Takahira . | |
| 5,393,001 | 2/1995 | Gustafson . | |

FOREIGN PATENT DOCUMENTS

| | | |
|---|---|---|
| 1 050 118 | 1/1954 | France . |
| 2074150 | 10/1971 | France . |
| 0 150 315 | 6/1955 | Germany . |
| 57-141907 | 9/1982 | Japan . |
| 63-211712 | 9/1988 | Japan . |
| 402144907 | 6/1990 | Japan ............... 242/439 |
| 632897 | 11/1982 | Switzerland . |
| 1 437 333 | 5/1976 | United Kingdom . |
| WO92/22827 | 12/1992 | WIPO . |

*Primary Examiner*—Carl E. Hall
*Attorney, Agent, or Firm*—Oliff & Berridge

[57] ABSTRACT

The process for assembly of a coil with or without a core on a printed circuit comprises placing the printed circuit in the winding machine before starting the winding. When the Flyer brings the wire for the winding, it causes the latter to pass over a metallized path of the printed circuit while keeping said wire taut. After the Flyer has effected the number of turns necessary for the winding, it will carry the wire along, passing onto a second metallized path, always keeping it taut. The soldering of the two end wires of the winding on the respective metallized paths will take place very easily since each of said wires is held taut at the location where the soldering is to take place. This process permits automating the production of miniaturized electronic circuits comprising a winding.

21 Claims, 2 Drawing Sheets

PROCESS FOR ASSEMBLING A COIL ON A PRINTED CIRCUIT

This is a Division of Continuation-In-Part of application No. 07/948,587 filed Sep. 23, 1992, which in turn is a Continuation-In-Part of International Application Nos. PCT/EP91/00672 and PCT/EP92/00363, filed Apr. 1, 1991 and Feb. 20, 1992, and U.S. patent application 07/833,370, filed Feb. 10, 1992, now U.S. Pat. No. 5,393,001, issued Feb. 28, 1995, respectively.

The miniaturization of electronic circuits entails the necessity of finding new and original solutions for the assembly and connection of the miniaturized components, in particular when it is necessary to join the end wires of a coil to a printed circuit further including one or more discrete components, as well as one or more integrated circuits.

Such circuits including a coil are to be found in particular in numerous applications in which there is transmission and/or reception of an electromagnetic radio frequency signal; among these applications, there may be cited the so-called "intelligent" credit card, as well as wireless search or detection apparatus.

One of the problems connected with the fabrication of such circuits comes from the very small diameter of the wire used for the coil, thus making it very difficult to seize end wires of the coil having to be brought to and soldered on the respective paths of a printed circuit. Moreover, automatic and high-speed mass production of these circuits, in order to reduce their production cost, requires putting in new means for assembling the coil on the printed circuit.

For this purpose, a process has been developed, permitting assembly of a coil on a printed circuit, in a single operation, directly on a winding machine comprising a Flyer (a description of which is presented in U.S. patent applications 07/656,137 to Cuttelod and 07/833,370 and PCT/EP92/00363 to Gustafson, fully incorporated herein by reference), and including the steps mentioned in the characterizing clause of claim 1 when there is an air-core coil, and of claim 2 when there is a coil with a core.

Figure 2:
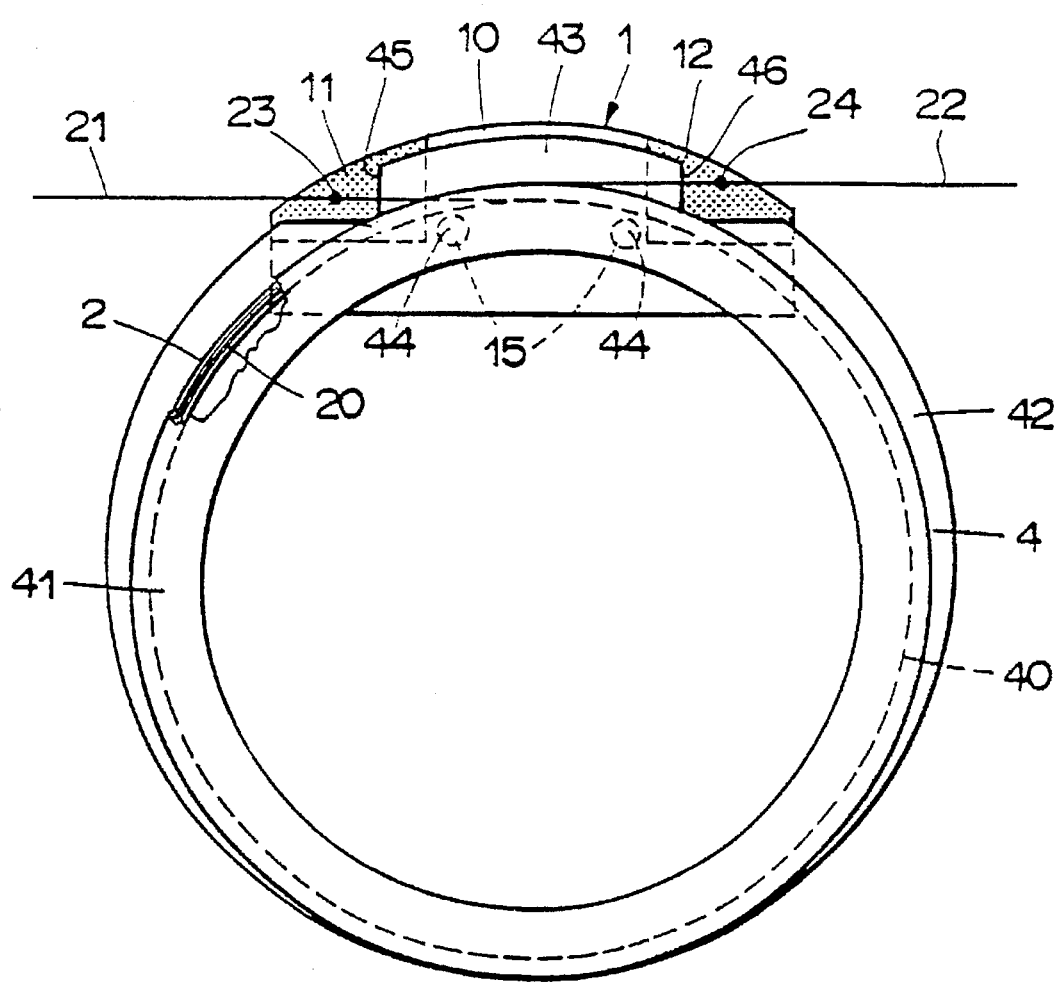

The principle and the details of the assembly process according to the invention are explained starting from the appended drawing with the figures in which:

FIG. 1 represents a plan view of an air-core coil in the process of being assembled with a printed circuit, and FIG. 2 represents a plan view of a coil comprising a core, in the process of being assembled with a printed circuit.

In FIG. 1, there is first of all a printed circuit 1 composed of a thin insulating support 10 (on the order of tenths of a mm thick), comprising in particular two metallized paths 11 and 12. One or more discrete miniaturized components, as well as one or more integrated circuits, all symbolized in the figure by the element 13, are connected to the two conductor paths 11 and 12. This printed circuit 1 is first of all put in place on the winding machine (not shown). For forming the winding 2, made up of a wire 20 of very small diameter (a few hundredths of a mm), the winding head, i.e., the Flyer, brings the winding-wire end 21, still connected to the previously wound coil (not shown), into position for winding the winding 2; for this purpose, the wire end 21 remains taut and passes directly above the metallized path 11, winding taking place on a form (not shown) in order to give the coil 2 the required shape. After the Flyer has effected the number of revolutions corresponding to the number of turns necessary on the coil, it will leave the winding position, carrying along the winding-wire end 22, causing it to pass directly above the metallized path 12 and leading it toward the next coil to be wound (not shown), always keeping the wire end 22 taut. There is thus an assembly, held on the machine, which it now suffices to cause to stick together by disposing gluing means on the insulating portion 14 of the printed circuit 1 and by automatically soldering the winding-wire end 21 to the conductor path 11 at the joint 23 and the winding-wire end 22 to the conductor path 12 at the joint 24. It is then possible to cut or tear the winding-wire end 21 before the joint 23, then the winding-wire end 22 after the joint 24, this after the following winding has been terminated, in order to have an air-core coil 2 assembled permanently on a printed circuit. It will then remain to complete the mounting of possible additional components and to encapsulate the winding and the circuit between two layers of plastic to constitute, for example, a so-called "intelligent" credit card 3.

In case, for a topological reason or for any other reason, it is not advantageous that the winding-wire end 21 does not arrive in a straight line from the preceding winding, it is quite possible to modify the angle of arrival of the winding-wire end 21a at the printed circuit in order to choose another location of the metallized path 11 where the joint 23a will be made. For this purpose, the support holding the printed circuit comprises a fixed guide point 25, above which the Flyer passes, in order to guide the winding end wire 21a suitably. This situation is depicted in dot-dash lines in the figure; it is quite obvious that it may also apply to the choice of another location for the soldering of the joint 24 of the winding end wire 22.

Some of the elements previously mentioned are to be found again in FIG. 2, viz., a printed circuit 1 made up of a thin insulating support 10 and comprising two conductor paths 11 and 12. A coil core 4 of synthetic material is made up of a cylindrical barrel, represented by the broken line 40, of a front flange 41, concentric with the barrel 40, and of a rear flange 42, eccentric relative to the barrel 40 and to the front flange 41. The coil 2 of fine wire 20 will be wound in the space situated between the outside surface of the barrel 40 and the two inner faces of the front and rear flanges 41, 42. The rear flange 42 is eccentric in order to present a support surface 43 on which the printed circuit 1 will rest, held by two projections 44 of the core 4, co-operating with two holes 15 pierced in the support 10 of the printed circuit 1 in order to hold these two elements together. The rear flange 42 further has two notches 45 and 46 which face the two conductor paths 11 and 12 of the printed circuit 1. Thus, when the printed circuit 1 has been put in place on the winding machine, when the core 4 has been superimposed on it and fixed by means of the projections 44 and the holes 15, the Flyer (not shown) will be able to bring the wire end 21 in the same way as previously and to start the winding over the barrel 40 by having passed the wire 21 immediately above the conductor path 11. When the number of turns necessary have been wound, the Flyer will carry the end wire 22 along toward the next coil to be wound, passing immediately above the conductor path 12; as previously, the joints 23 and 24 fix the end wires 21 and 22 on the respective conductor paths 11 and 12. After cutting or tearing of the free end wires before and after the joints 23 and 24, and withdrawal of the unit made up of a coil 2 on a core 4 assembled with a printed circuit 1, there is a fixed assembly which can be integrated in an electronic circuit. As previously, other components or integrated circuits (not shown) could already have been fixed to the printed circuit before its assembly with the coil. It is also possible to modify the angle of arrival or departure of the wires 21 and 22 by disposing one or two guide points, which permits the locations where the soldering will take place to be suitably chosen.

Different variants in the processes described above may be mentioned, all of which enter within the scope of the protection offered by the claims; in particular, the fixing of the discrete components and/or of the integrated circuit or circuits on the printed circuit may take place either before the printed circuit is assembled with the coil, or after this operation; likewise, the fixing of the core on the printed circuit may take place before or after having put the latter on the winding machine. For the operation of soldering the winding-wire ends on the conductor paths, it is important that said wire ends be held and kept taut in some way before carrying out the soldering, it is the only way of being able really to make the production of such circuits more efficient since it is then not necessary to search for one or two extremely fine winding-wire ends, a hazardous, difficult, and long, therefore expensive, operation.

Thus, by carrying out the soldering of the end wires of the winding on the respective metallized paths of the printed circuit, while they are still held in one way or another in the winding machine, it is possible, by this process, to obtain increased productivity in the manufacture of miniaturized electronic circuits including a winding; moreover, the processes described permit the production of extremely thin circuits seeing that the total thickness of the circuit is made up only of the thickness of the coil on which a thickness of the printed circuit is superimposed, itself consisting of a very thin sheet. These advantageous qualities are obtained through the fact that the end wires of the winding are soldered on the paths disposed outside of the winding, whereas the other elements of the electronic circuit, or the integrated circuit, respectively, are lodged in the space situated in the center of the coil, said space being of a sufficient dimension, or thickness, to receive these other circuit elements.

I claim:

1. A process for assembling a coil of wire on a core onto a printed circuit, wherein:
    the printed circuit comprises:
        two metallized paths for receiving ends of the wire,
        a portion for physically attaching the core to the printed circuit, and
        a plurality of holes formed in said portion of the printed circuit; and
    the core is formed of a synthetic material and comprises:
        a cylindrical barrel,
        a front flange,
        a rear flange,
        a plurality of pins provided on an outside surface of the rear flange, and
        a pair of notches provided in the rear flange opposite the two metallized paths;
    the process comprising:
        placing the printed circuit into a winding machine, the metallized paths being accessible for soldering the wire ends thereto;
        inserting the plurality of pins into the plurality of holes to physically attach the core to the printed circuit such that the pair of notches provide access to the two metallized paths;
        forming the coil on the core adjacent to the printed circuit each one of the wire ends passing over a corresponding one of the metallized paths of the printed circuit; and
        soldering each one of the wire ends to the corresponding one of the metallized paths.

2. The process of claim 1, wherein the coil is formed with a flyer, and the wire ends are kept taut during the forming and soldering steps.

3. The process of claim 1, wherein the printed circuit has at least one electronic component attached thereto prior to the placing step.

4. The process of claim 2, further comprising the step of cutting or tearing off the wire ends beyond points where they are soldered to the metallized paths.

5. The process of claim 4, further comprising, prior to the cutting or tearing step, the steps of:
    placing a second printed circuit into the winding machine;
    forming a second coil adjacent the second printed circuit with the flyer, wire ends of the second coil being kept taut, and each one of the wire ends of the second coil passing over a corresponding one of two metallized paths of the second printed circuit; and
    soldering at least a first one of the wire ends of the second coil on the corresponding one of the two metallized paths of the second printed circuit.

6. The process of claim 1, wherein the soldering is performed automatically.

7. The process of claim 2, wherein the flyer includes a tubular applicator for dispensing the wire.

8. A process for assembling a coil of wire, formed on a synthetic core onto a printed circuit, wherein:
    the printed circuit comprises:
        two metallized paths for receiving ends of the wire,
        a portion for physically attaching the core to the printed circuit; and
        a plurality of holes formed in said portion of the printed circuit; and
    the synthetic core comprises:
        a cylindrical barrel,
        a front flange,
        a rear flange,
        a plurality of pins provided on an outside surface of the rear flange, and
        a pair of notches provided in the rear flange opposite the metallized paths;
    the process comprising:
        inserting the plurality of pins into the plurality of holes to physically attach the core to the printed circuit such that the pair of notches provides access to the two metallized paths;
        placing the printed circuit into a winding machine, the metallized paths being accessible for soldering the wire ends thereto;
        forming the coil on the core by winding the wire around the core between the front and rear flanges, each one of the wire ends passing over a corresponding one of the metallized paths of the printed circuit; and
        soldering each one of the wire ends to the corresponding one of the metallized paths.

9. The process of claim 8, wherein the coil is formed with a flyer, and the wire ends are kept taut during the forming and soldering steps.

10. The process of claim 8, wherein at least one electronic component in addition to the core is attached to the printed circuit prior to the placing step.

11. The process of claim 9, further comprising the step of cutting or tearing off the wire ends beyond points where they are soldered to the metallized paths.

12. The process of claim 11, further comprising, prior to the cutting or tearing step, the steps of:
    physically attaching a second core to a second printed circuit;
    placing the second printed circuit into the winding machine;

forming a second coil on the second core with the flyer, wire ends of the second coil being kept taut, and each one of the wire ends of the second coil passing over a corresponding one of two metallized paths of the second printed circuit; and soldering at least a first one of the wire ends of the second coil on the corresponding one of the two metallized paths of the second printed circuit.

13. The process of claim 8, wherein the soldering is performed automatically.

14. The process of claim 9, wherein the flyer includes a tubular applicator for dispensing the wire.

15. An automated method for manufacturing a passive transponder device, comprising:

bonding an electronic device comprising at least one integrated circuit chip onto a printed circuit, the printed circuit comprising:
a plurality of metallized paths having first portions and second portions, and
a plurality of holes formed in said second portions of the metallized paths;

electrically connecting the electronic device to the metallized paths of the printed circuit;

encapsulating the electronic device and the first portions of the metallized paths in a plastic material such that the second portions of the metallized paths protrude therefrom;

forming a coil by winding a conductive wire around a core, the core formed of a synthetic material and comprising:
a cylindrical barrel,
a front flange,
a rear flange,
a plurality of pins provided on an outside surface of the rear flange, and
a pair of notches provided in the rear flange opposite6 the second portions of the two metallized paths;

inserting the plurality of pins into the plurality of holes to physically attach the core to the printed circuit such that the pair of notches provides access to the two metallized paths; and conductively connecting wire ends of the wire to said second portions of the metallized paths.

16. The process of claim 15, wherein the coil is formed with a flyer, such that the wire ends are kept taut during the forming and conductively connecting steps.

17. The process of claim 16, further comprising the step of cutting or tearing off ends of the wire beyond points where the wire is conductively connected to said second portions of the metallized paths.

18. The process of claim 17, further comprising, prior to the cutting or tearing step, the steps of:

bonding a second electronic device comprised of at least one integrated circuit chip onto a second printed circuit comprising a plurality of metallized paths;

electrically connecting the second electronic device to the metallized paths of the second printed circuit;

encapsulating the second electronic device and first portions of the metallized paths of the second printed circuit in a plastic material such that second portions of the metallized paths of the second printed circuit protrude therefrom;

forming a second coil of wire by winding said conductive wire around a second core with the flyer, wire ends of the second coil being kept taut; and conductively connecting at least a first one of the wire ends of the second coil to a corresponding one of said second portions of the metallized paths of the second printed circuit.

19. The process of claim 16, wherein the step of winding the conductive wire around the core comprises rotating the flyer around the core at high rpm.

20. The process of claim 15, wherein the soldering is performed automatically.

21. The process of claim 15, wherein the flyer includes a tubular applicator for dispensing the wire.

* * * * *